United States Patent
Iida et al.

(10) Patent No.: US 9,899,446 B2
(45) Date of Patent: Feb. 20, 2018

(54) SOLID-STATE IMAGE SENSING DEVICE

(71) Applicant: Renesas Electronics Corporation, Tokyo (JP)

(72) Inventors: Tetsuya Iida, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/372,775

(22) Filed: Dec. 8, 2016

(65) Prior Publication Data
US 2017/0229510 A1    Aug. 10, 2017

(30) Foreign Application Priority Data
Feb. 10, 2016 (JP) ................................ 2016-023788

(51) Int. Cl.
*H01L 27/14* (2006.01)
*H01L 27/146* (2006.01)

(52) U.S. Cl.
CPC .... *H01L 27/14643* (2013.01); *H01L 27/1461* (2013.01); *H01L 27/14607* (2013.01); *H01L 27/14614* (2013.01)

(58) Field of Classification Search
CPC ......... H01L 27/14643; H01L 27/14607; H01L 27/1461; H01L 27/14614
See application file for complete search history.

(56) References Cited

U.S. PATENT DOCUMENTS

| | | | | |
|---|---|---|---|---|
| 8,284,282 B2* | 10/2012 | Oike | ................. | H01L 27/14609 348/241 |
| 8,482,645 B2* | 7/2013 | Takatsuka | .............. | H04N 5/353 348/241 |
| 8,570,410 B2* | 10/2013 | Oike | ................. | H01L 27/14609 348/294 |
| 8,629,484 B2* | 1/2014 | Ohri | .................. | H01L 27/14607 257/290 |
| 8,901,618 B2* | 12/2014 | Fukuro | ............ | H01L 27/14612 257/229 |
| 8,934,036 B2* | 1/2015 | Oike | ................. | H01L 27/14609 348/294 |
| 8,947,573 B2* | 2/2015 | Sogoh | ............... | H01L 27/14609 348/311 |

(Continued)

FOREIGN PATENT DOCUMENTS

JP    2012-129797 A    7/2012

*Primary Examiner* — Ida M Soward
(74) *Attorney, Agent, or Firm* — Mattingly & Malur, PC

(57) ABSTRACT

A solid-state image sensing device capable of suppressing a dark current and transfer failure during a global shutter operation is provided. The solid-state image sensing device according to one embodiment includes: a semiconductor substrate having a main surface and a back surface being on the opposite side of the main surface; a well region arranged in contact with the main surface in the semiconductor substrate; a photoelectric conversion region arranged in contact with the main surface in the well region; a charge holding region arranged in contact with the main surface in the well region; a floating diffusion region arranged in contact with the main surface in the well region; a first transfer gate so formed as to face the well region and the charge holding region; and a second transfer gate so formed as to face the well region.

4 Claims, 7 Drawing Sheets

(56) References Cited

U.S. PATENT DOCUMENTS

| | | | | |
|---|---|---|---|---|
| 8,952,432 B2* | 2/2015 | Oike | ................ | H01L 27/14616 |
| | | | | 257/291 |
| 9,054,009 B2* | 6/2015 | Oike | ................ | H01L 27/14612 |
| 9,142,576 B2* | 9/2015 | Machida | ............ | H01L 27/14601 |
| 9,177,980 B2* | 11/2015 | Sogoh | ............... | H01L 27/14609 |
| 9,293,503 B2* | 3/2016 | Sakano | ............ | H01L 27/14609 |
| 9,385,154 B2* | 7/2016 | Okuno | ............. | H01L 27/14643 |
| 9,419,045 B2* | 8/2016 | Sogoh | ............. | H01L 27/14609 |
| 9,450,003 B2* | 9/2016 | Oike | ................ | H01L 27/14616 |
| 2011/0233707 A1* | 9/2011 | Fukuro | ............ | H01L 27/14612 |
| | | | | 257/435 |
| 2011/0242379 A1* | 10/2011 | Kato | ................ | H01L 27/14609 |
| | | | | 348/300 |
| 2011/0248371 A1* | 10/2011 | Matsumura | ....... | H01L 27/14612 |
| | | | | 257/443 |
| 2013/0208156 A1* | 8/2013 | Yamashita | ............ | H04N 5/353 |
| | | | | 348/296 |
| 2015/0264283 A1* | 9/2015 | Kobayashi | ............ | H04N 5/361 |
| | | | | 257/229 |
| 2016/0254305 A1* | 9/2016 | Sakano | ............ | H01L 27/14609 |
| | | | | 257/231 |

\* cited by examiner

SOLID-STATE IMAGE SENSING DEVICE

CROSS-REFERENCE TO RELATED APPLICATIONS

The disclosure of Japanese Patent Application No. 2016-023788 filed on Feb. 10, 2016 including the specification, drawings and abstract is incorporated herein by reference in its entirety.

BACKGROUND

The present invention relates to a solid-state image sensing device and, in particular, to a CMOS (Complementary Metal Oxide Semiconductor) image sensor.

In the solid-state image sensing device, photodiodes are arranged two-dimensionally. In a case of the CMOS image sensor, generally, exposure and reading are performed line-by-line basis. Therefore, when imaging a subject or the like which is rotating at a high speed using the CMOS image sensor, a captured imaged tends to suffer a distortion. Such a phenomenon is known as a rolling shutter.

On the other hand, in a case of a CCD (Charge Coupled Device) image sensor, exposure and reading are performed on a frame-by-frame basis. Therefore, when the CCD image sensor is used, even if the subject is rotating at a high speed, the captured image does not suffer a distortion. Such a phenomenon is known as a global shutter.

In the CMOS image sensor also, there is a case where the global shutter operation is required. As a system for realizing the global shutter operation in the CMOS image sensor, there is one disclosed, for example, in Patent Document 1 (Japanese Unexamined Patent Application Publication No. 2012-129797).

The CMOS image sensor described in Patent Document 1 has a substrate. The substrate has a main surface and a back surface. In the substrate, a photodiode, a charge holding part, and a floating diffusion region are formed. The charge holding part has a p type region on the side of the main surface. Over the main surface, a gate insulating film is formed. Over the gate insulating film, a first transfer gate and a second transfer gate are formed.

In the CMOS image sensor disclosed in Patent Document 1, incident light is converted into an electric charge by the photodiode through photoelectric conversion. The charges photo-electrically converted in the photodiode are transferred for all unit pixels simultaneously to the charge holding part through the first transfer gate. Then, the charges are read sequentially on a row-by-row basis by the second transfer gate. Thus, the CMOS image sensor disclosed in Patent Document 1 realizes the global shutter operation.

Patent Document

[Patent Document 1] Japanese Unexamined Patent Application Publication No. 2012-129797

SUMMARY

In the CMOS image sensor of Patent Document 1, the first transfer gate is formed over the gate insulating film and in a region between the photodiode and the charge holding part. Therefore, even when the first transfer gate is turned on, the p type region is not depleted. As a result, the p type region which is not depleted becomes an obstacle and may cause transfer failure of charges from the photodiode to the charge holding part.

The other problems and novel features will become apparent from the description of the specification and appended drawings.

A solid-state image pickup device according to one embodiment includes: a semiconductor substrate having a main surface and a back surface being on the opposite side of the main surface; a well region arranged in contact with the main surface in the semiconductor substrate and being of a first conductivity type; a photoelectric conversion region arranged in contact with the main surface in the well region and being of a second conductivity type; a charge holding region arranged in contact with the main surface in the well region; a floating diffusion region arranged in contact with the main surface in the well region and being of the second conductivity type; a first transfer gate so formed, over the main surface, as to face a well region between the photoelectric conversion region and the charge holding region as well as to face the charge holding region while being insulated from each other; and a second transfer gate so formed, over the main surface, as to face a well region between the charge holding region and a floating diffusion region while being insulated from each other. The charge holding region includes: a pinning region formed in contact with the main surface; and an n type region formed in contact with the back surface of the pinning region.

According to the solid-state image sensing device of one embodiment of the present invention, it becomes possible to suppress a dark current and to suppress transfer failure during a global shutter operation.

DETAILED DESCRIPTION

Figure 1:
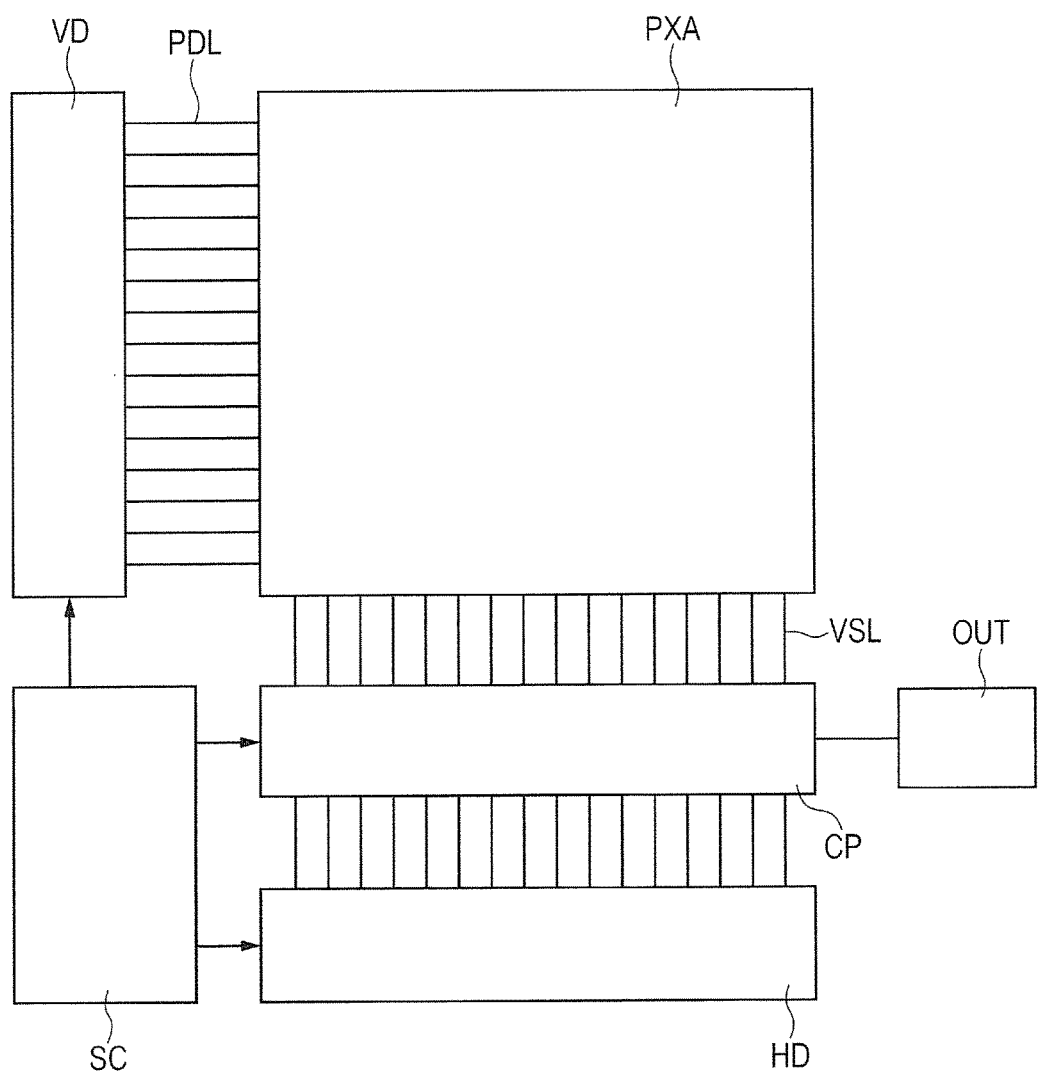
FIG. 1 is a schematic diagram showing a general configuration of a solid-state image sensing device according to an embodiment.

Hereinafter, the embodiment of the present invention will be explained with reference to the drawings. In the drawings, the same reference numerals and characters are given to the same or corresponding members. Also, at least some parts of the embodiment to be described below may be combined as required.

(General Configuration of Solid-State Image Sensing Device According to Embodiment)

Hereinafter, a general configuration of the solid-state image sensing device according to an embodiment will be explained.

As shown in FIG. 1, the solid-state image sensing device according to the first embodiment has an pixel array PXA, a vertical driver VD, a column processor CP, a horizontal driver HD, a system controller SC, and an output part OUT.

In the pixel array PXA, unit pixels PX (see FIG. 2) are arranged in the shape of a matrix. Each unit pixel PX includes a photoelectric conversion region PCR which performs photoelectric conversion of incident light and accumulates charges corresponding to the incident light. Also, a configuration of the unit pixel PX will be described later.

The pixel array PXA includes a pixel drive line PDL. The pixel drive line PDL is provided in each row of the unit pixel PX. In addition, though not shown in FIG. 1, a first transfer line TR1 (see FIG. 2), a second transfer line TR2 (see FIG. 2), a reset line RST (see FIG. 2), and a row selecting line SEL (see FIG. 2) are included in each pixel drive line PDL corresponding to each unit pixel PX. One end of the pixel drive line PDL is coupled to the vertical driver VD.

The pixel array PXA includes a vertical signal line VSL. The vertical signal line VSL is provided in each column of the unit pixel PX. One end of the vertical signal line VSL is coupled to a column processor CP.

The vertical driver VD drives each unit pixel PX in such a way that it drives all the pixels simultaneously or row by row. That is, with respect to each unit pixel PX, the vertical driver VD resets or transfers all the pixels simultaneously or row by row. The vertical driver VD is comprised of a shifting register, an address decoder, etc., for example.

The column processor CP includes a unit circuit which corresponds to each row of the pixel array PXA. The unit circuit is coupled to the vertical signal line VSL. The unit circuit performs signal processing to a signal according to an amount of electric charges accumulated in each unit pixel PX. A noise-removal process is included in this signal processing. The noise-removal process is, for example, a CDS (Correlated Double Sampling) process. Also, the signal processing performed by the unit circuit may include an analog-to-digital conversion process. Further, the unit circuit temporarily holds the processed signals.

The horizontal driver HD sequentially selects each unit circuit in the column processor CP. As a result, the processed signals held temporarily in the column processor CP are output sequentially to the output part OUT. The horizontal driver HD is comprised of a shifting register, an address decoder, etc.

The system controller SC includes, for example, a timing generator. The timing generator generates various timing signals. The various timing signals generated by the timing generator are supplied to the vertical driver VD, the column processor CP, and the horizontal driver HD. Thus, driving of the vertical driver VD, the column processor CP, and the horizontal driver HD is performed.

(Configuration of Unit Pixel of Solid-State Image sensing Device According to Embodiment)

Hereinafter, a configuration of the unit pixel PX of the solid-state image sensing device according to the embodiment will be explained.

Figure 2:
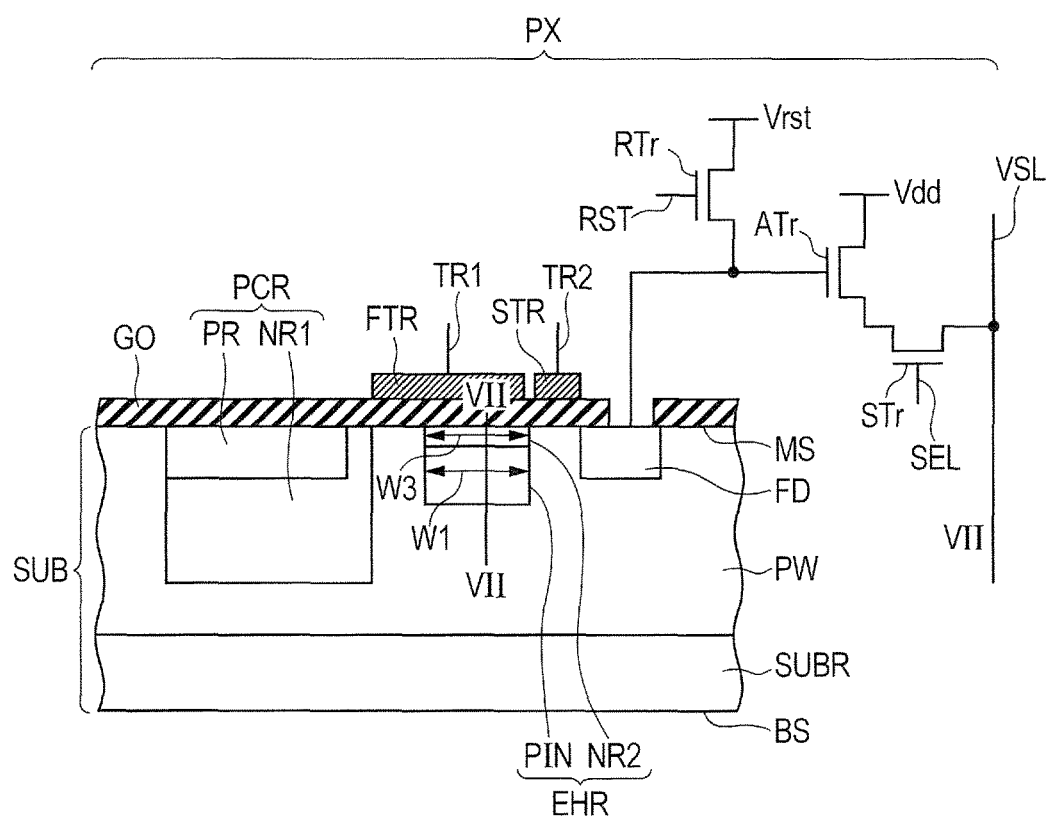
FIG. 2 is a schematic diagram showing a configuration of a unit pixel of the solid-state image sensing device according to the embodiment.

As shown in FIG. 2, the solid-state image sensing device according to the embodiment has a semiconductor substrate SUB. The semiconductor substrate SUB has a main surface MS and a back surface BS. In this regard, the back surface BS is on the opposite side of the main surface MS.

A substrate region SUBR is formed in the semiconductor substrate SUB. The substrate region SUBR is arranged in contact with the back surface BS of the semiconductor substrate SUB. A p type well region PW is formed in the semiconductor substrate SUB. The p type well region PW is formed in contact with the main surface MS of the semiconductor substrate SUB. The gate insulating film GO is formed over the main surface MS of the semiconductor SUB. $SiO_2$ (silicon dioxide) is used for a material of the gate insulating film GO, for example.

The unit pixel PX of the solid-state image sensing device according to the embodiment has a photoelectric conversion region PCR, a charge holding region EHR, a floating diffusion region FD, the first transfer gate FTR, and the second transfer gate STR. Moreover, the unit pixel PX of the solid-state image sensing device according to the first embodiment further includes an amplifying transistor ATr, a reset transistor RTr, and a row selecting transistor STr.

The charges produced in the semiconductor substrate SUB by photoelectric conversion of the incident light are accumulated in the photoelectric conversion region PCR. The photoelectric conversion region PCR is formed in contact with the main surface MS in the p type well region PW. The photoelectric conversion region PCR is, for example, a buried photodiode. That is, the photoelectric conversion region PCR includes a p type region PR and a first n type region NR1.

The p type region PR is formed in contact with the main surface MS (namely, in contact with the gate insulating film GO) in the p type well region PW. A side portion of the p type region PR is in contact with the p type well region PW. The first n type region NR1 is formed in contact with a back surface BS side of the p type region PR in the p type well region PW.

The p type region PR prevents a dark current that occurs at a boundary between the main surface MS of the semiconductor substrate SUB and the gate insulating film GO from flowing into the first n type region NR1 side.

The charge holding region EHR holds temporarily the charges transferred from the photoelectric conversion region PCR. The charge holding region EHR is formed in contact with the main surface MS in the p type well region PW. The charge holding region EHR is spaced from the photoelectric conversion region PCR. The charge holding region EHR has a pinning region PIN and a second n type region NR2.

The pinning region PIN is formed in contact with the main surface MS (namely, in contact with the gate insulating film GO) in the p type well region PW. A side portion of the pinning region PIN is in contact with the p type well region PW. The second n type region NR2 is formed in contact with a back surface BS side of the pinning region PIN in the p type well region PW.

The pinning region PIN has a first width W1 and a second width W2 (not shown). The second n type region NR2 has a third width W3 and a fourth width W4 (not shown). The first width W1 and the third width are the widths in the direction of a gate length of the first transfer gate FTR. The second width W2 and the fourth width W4 are the widths in the direction of a gate width of the first transfer gate.

It is preferable that the first width W1 should be equal to or greater than the third width W3. It is preferable that the second width W2 should be equal to or greater than the fourth width W4. If this is seen from another viewpoint, there is no portion which is in contact with the main surface MS of the semiconductor substrate SUB (in contact with the gate insulating film GO) in the second n type region NR2.

That is, the side portion of the pinning region PIN is in contact with the p type well region PW all over the circumference.

The pinning region PIN is, for example, of the p conductivity type. When the pinning region PIN is of the p conductivity type, it is preferable that the concentration of p type impurities of the pinning region PIN should be lower than the impurity concentration of the p type impurities of the p type well region PW. One example of the impurity concentration of the pinning region PIN is: $1\times10^{16}/cm^3$.

In addition, the conductivity type of the pinning region PIN is not limited to the p type. The conductivity type of the pinning region PIN may be an n type. When the conductivity type of the pinning region PIN is the n type, the concentration of the n type impurities of the pinning region PIN is lower than a concentration of n type impurities of the second n type region NR2.

It is preferable that the concentration of the n type impurities of the second n type region NR2 should be lower than that of the floating diffusion region FD. As for the concentration of the n type impurity of the n type region NR2, it is preferable that the concentration of the n type impurities of the second n type region NR2 should be set such that complete depletion is achieved by a reset potential Vrst applied to the floating diffusion region FD through the reset transistor RTr. One example of the concentration of the n type impurities of the second n type region NR2 is: $1\times10^{17}/cm^3$.

The floating diffusion region FD holds charges transferred from the charge holding region EHR. The conductivity type of the floating diffusion region FD is an n type. The floating diffusion region FD is formed in contact with the main surface MS in the p type well region.

The floating diffusion region FD is coupled to a gate of the amplifying transistor ATr. A drain of the amplifying transistor ATr is coupled to a fixed potential Vdd. A source of the amplifying transistor ATr is coupled to a drain of the row selecting transistor STr. A source of the row selecting transistor is coupled to the vertical signal line VSL. Though not shown in FIG. 2, a load transistor is formed over the vertical signal line VSL. A gate of the row selecting transistor STr is coupled to a row selecting line SEL.

Therefore, in a state where the row selecting transistor STr is turned on, a charge held in the floating diffusion region FD is converted into a voltage through a source follower operation of the amplifying transistor ATr. As a result, a signal corresponding to the charge accumulated in the unit pixel PX is output to the vertical signal line VSL.

The floating diffusion region FD serves as a source of the reset transistor RTr. A reset potential Vrst is applied to a drain of the reset transistor RTr. A gate of the reset transistor RTr is coupled to a reset line RST. By the reset transistor RTr being turned on (when the reset line RST being made high), charges are discharged from the floating diffusion region FD. Thus, the floating diffusion region FD is reset.

A first transfer gate FTR is coupled to a first transfer line TR1. By being turned on (when the first transfer line TR1 being turned on), the first transfer gate FTR transfers the charges accumulated in the photoelectric conversion region PCR to the charge holding region EHR. Also, voltages applied during the on-state and off-state of the first transfer gate FTR will be explained later.

The first transfer gate FTR is formed over the gate insulating film GO. More specifically, the first transfer gate FTR is so formed as to face the p type well region PW between the photoelectric conversion region PCR and the charge holding region EHR and to face the charge holding region HER while being insulated from each other. In addition, the first transfer gate FTR does not need to be formed all over the charge holding region EHR. For a material of the first transfer gate FTR, polycrystalline silicon (Si) where impurities are doped, for example, is used.

A second transfer gate STR is coupled to a second transfer line TR2. By being turned on (when the second transfer line TR2 being turned on), the second transfer gate STR transfers the charges held in the charge holding region EHR to the floating diffusion region FD.

The second transfer gate STR is formed over the gate insulating film GO. More specifically, the second transfer gate STR is so formed as to face the p type well region PW between the charge holding region EHR and the floating diffusion region FD while being insulated from each other. For a material of the second transfer gate STR, polycrystalline silicon (Si) where impurities are doped, for example, is used.

Though not shown in FIG. 2, the gate insulating film GO, the first transfer gate FTR, and the second transfer gate STR are covered with an interlayer insulating film containing $SiO_2$ etc. Though not shown in FIG. 2, a wiring of Al (aluminum), Cu (copper), etc. is formed over the interlayer insulating film. A space above the charge holding region EHR and a space above the floating diffusion region FD are shielded by the wiring.

(Operation of Solid-State Image Sensing Device According to Embodiment)

Hereinafter, the global shutter operation of the solid-state image sensing device of the embodiment will be explained.

Figure 3:
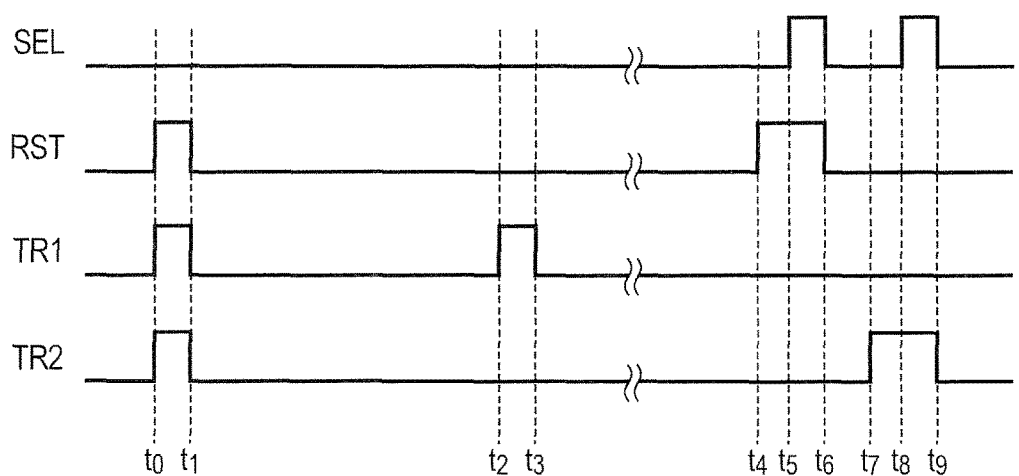
FIG. 3 is a timing chart during a global shutter operation of the solid-state image sensing device according to the embodiment.

As shown in FIG. 3, at time $t_0$, in all the unit pixels PX, the reset line RST, the first transfer line TR1, and the second transfer line TR2 are turned on. As a result, charges left in the photoelectric conversion region PCR, the charge holding region EHR, and the floating diffusion region FD are discharged. That is, the photoelectric translation region PCR, the charge holding region EHR, and the floating diffusion region FD are reset.

At time $t_1$, the reset line RST, the first transfer line TR1, and the second transfer line TR2 are turned off again. Therefore, at time $t_1$, accumulation of charges is started. That is, at time $t_1$, in the photoelectric conversion region PCR, there are started photoelectrical conversion of incident light and accumulation of photo-electrically converted charges. The photoelectrical conversion and the accumulation of the charges are continued until time $t_2$. As a result, a period between time $t_1$ and time $t_2$ serves as an accumulation period.

Between time $t_2$ and time $t_3$, in all the unit pixels PX, first transfer lines TR1 are turned on. As a result, in all the unit pixels PX, the charges accumulated in the photoelectric conversion region PCR during the accumulation period are transferred to the charge holding region EHR. After that, the first transfer line TR1 remains in an off state.

During a period between time $t_3$ and time $t_4$, there is performed a reading process of unit pixels PX existing between a first row and a (k−1) th row (k: integer being two or greater). Between time $t_4$ and time $t_9$, a reading process of unit pixels PX in a kth row is performed.

The reading process of unit pixels PX existing between the first row and the (k−1) th row is the same as the reading process of the unit pixels PX in the kth row. Therefore, in FIG. 3, the reading process of the unit pixels PX between the first row and the (k−1) th row is omitted.

At time $t_4$, a reset line RST of the unit pixel PX in the kth row is turned on. As a result, a floating diffusion region FD of the unit pixel PX in the kth row is reset. Subsequently, at time $t_5$, a row selecting line SEL of the unit pixel PX in the kth row is turned on.

As a result, through the amplifying transistor ATr and the row selecting transistor STr, there is read, over the vertical signal line VSL, a signal corresponding to a reset level of the floating diffusion region FD of the unit pixel PX in the kth row. The signal thus read is temporarily held in the column processor CP. Subsequently, at time $t_6$, the reset line RST and the row selecting line SEL of the unit pixel PX in the kth row are turned off.

Subsequently, at time $t_7$, a second transfer line TR2 of the unit pixel PX in the kth row is turned on. As a result, the charge held in the charge holding region EHR of the unit pixel PX in the kth row is transferred to the floating diffusion region FD of the unit pixel PX in the kth row.

Furthermore, at time $t_8$, the row selecting line SEL of the unit pixel PX in the kth row is turned on. As a result, there is read, over the vertical signal line VSL, a signal corresponding to the charge transferred, through the amplifying transistor ATr and the row selecting transistor STr, to the floating diffusion region FD of the unit pixel PX in the kth row.

With use of the signal corresponding to the charge thus read and a signal corresponding to a reset level, the column processor CP performs a CDS process. According to this process, the column processor CP obtains a signal corresponding to a charge having gone through noise cancellation. At time $t_9$, the row selecting line SEL and the second transfer line TR2 of the unit pixel PX in the kth row are turned off. Thus, the reading process of the unit pixel PX in the kth row is completed.

According to the above process, in all the unit pixels PX, a period between time $t_1$ and time $t_2$ serves as an accumulation period. Therefore, synchronism of accumulation periods is maintained. That is, the global shutter operation is realized by the operation of the solid-state image sensing device according to the above embodiment.

Figure 4A:
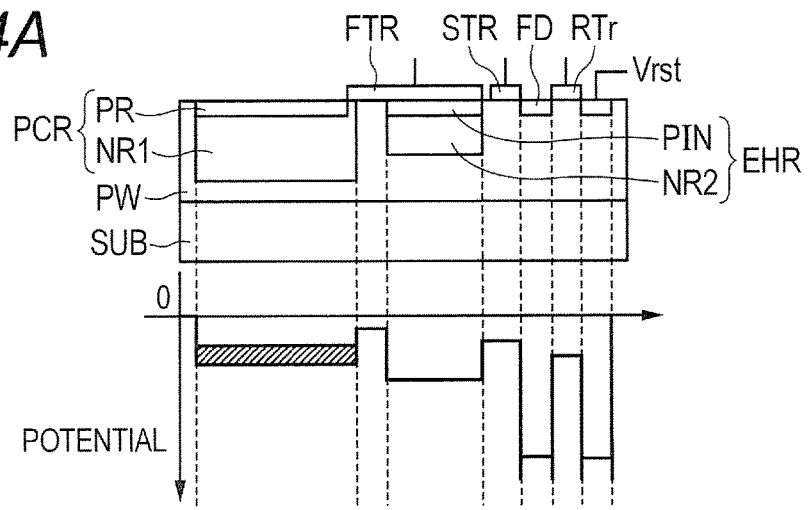
FIGS. 4A to 4C are potential diagrams during the global shutter operation of the solid-state image sensing device according to the embodiment.

Now, a charge transfer operation of the solid-state image sensing device of the embodiment will be explained. FIG. 4A is a potential diagram at the time the accumulation period is over. As shown in FIG. 4A, charges produced through photoelectric conversion of the incident light are accumulated in a potential well formed in the photoelectric conversion region PCR.

Figure 4B:
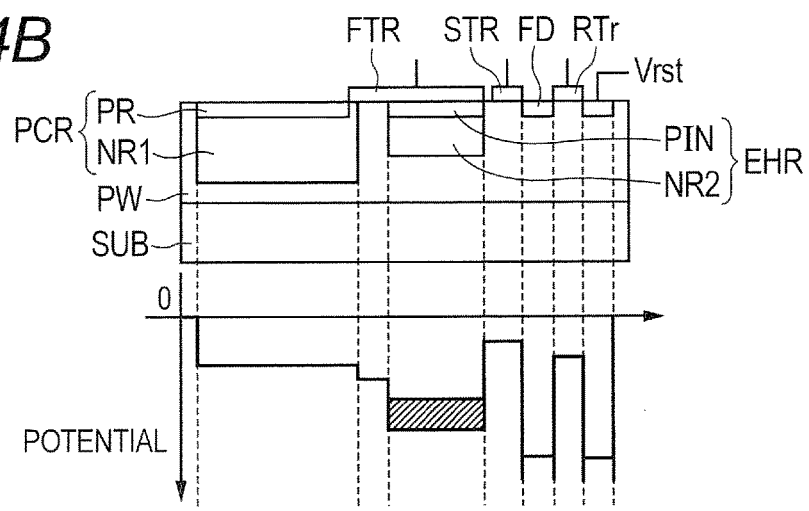

FIG. 4B is a potential diagram when the first transfer gate FTR is in an on state. As shown in FIG. 4B, when the first transfer gate FTR is turned on, a potential barrier between the photoelectric conversion region PCR and the charge holding region EHR is lowered. Moreover, the first transfer gate FTR is formed also over the charge holding region EHR as described above. Therefore, a potential of the charge holding region EHR is deeper than a potential of the photoelectric conversion region PCR. According to this potential gradient, charges accumulated in the photoelectric conversion region PCR are transferred to the charge holding region EHR.

Figure 4C:
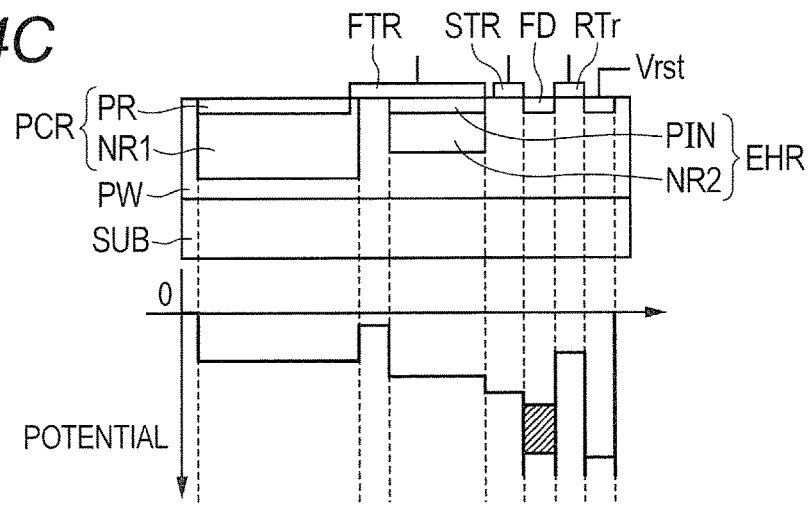

FIG. 4C is a potential diagram when the second transfer gate STR is in an on state. As shown in FIG. 4C, when the second transfer STR is turned on, a potential barrier between the charge holding region EHR and the floating diffusion region FD is lowered. When the second transfer gate STR is in the on state, as described, the first transfer gate FTR is in an off state. Therefore, the potential of the charge holding region EHR is shallower than a potential of the floating diffusion region FD. According to this potential gradient, charges held in the charge holding region EHR are transferred to the floating diffusion region FD. According to the above operation, the charges accumulated in the photoelectric conversion region PCR are transferred to the floating diffusion region FD through the charge holding region EHR.

Now, an explanation will be given to a voltage applied to the first transfer gate of the solid-state image sensing device according to the embodiment.

As the voltage at which the first transfer gate FTR is turned on, a voltage allowing the pinning region PIN to be depleted is selected. As the voltage at which the first transfer gate FTR is turned off, a voltage causing pinning in the pinning region PIN is selected.

Figure 5:
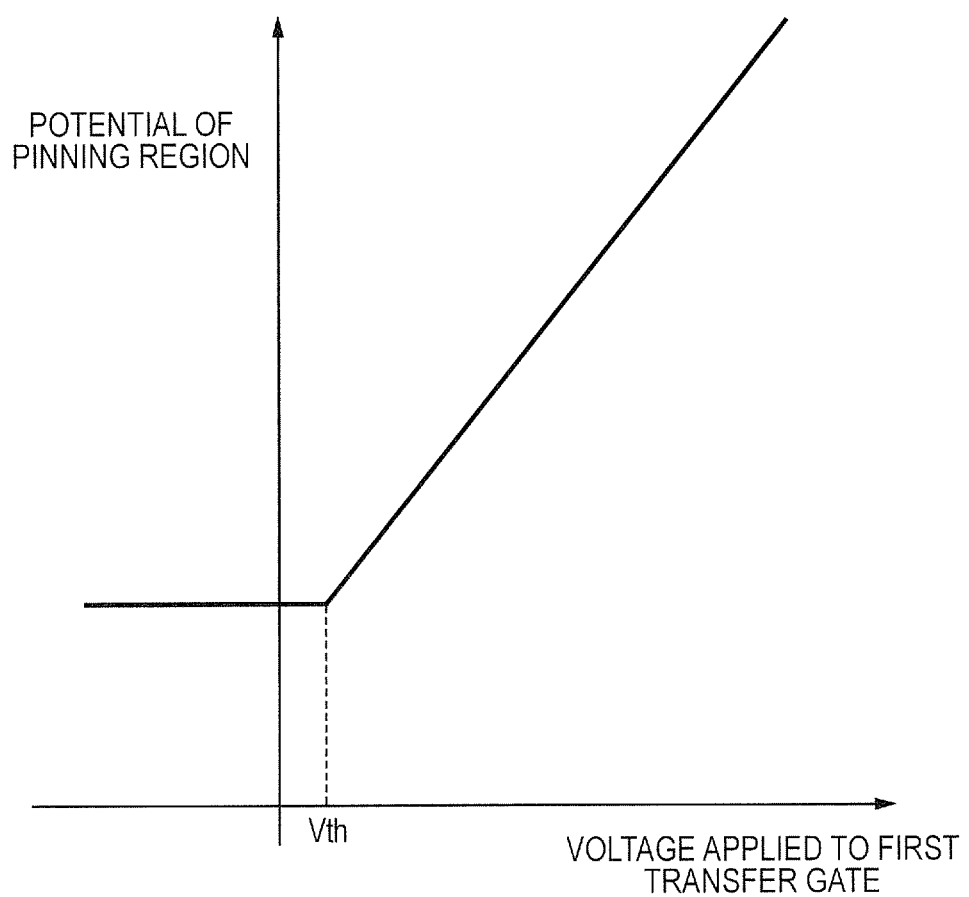
FIG. 5 is a schematic diagram showing the relation between potential of a pinning region and a voltage of a first transfer signal.

This point will be specifically explained below. As shown in FIG. 5, when a voltage lower than a threshold voltage $V_{th}$ is applied, regardless of the voltage applied to the first transfer gate FTR, the pinning region PIN shows a constant potential. That is, in this state, pinning has been caused in the pinning region PIN. On the other hand, when a voltage higher than the threshold voltage $V_{th}$ is given to the pinning region PIN, as the voltage applied to the first transfer gate FTR rises, the potential goes up.

Regardless of the voltage applied to the first transfer gate FTR in the pinning region PIN, a voltage applied to the first transfer gate FTR during the off state is selected from ones in a range showing a constant potential. To put it differently, as the voltage to be applied to the first transfer gate FTR in the off state, a voltage for causing pinning in the pinning region PIN is selected. On the other hand, the voltage applied to the first transfer gate FTR in the on state is selected from ones in a range where the potential of the pinning region PIN rises as the voltage applied to the first transfer gate FTR goes up.

In addition, as to the case where the pinning region PIN is of the n conductive type, the voltage at which the first transfer gate FTR comes to be in an off state is a negative voltage. This is because, in order to cause pinning in the pinning region PIN, it is necessary to pour holes into the pinning region PIN from a periphery thereof by applying the negative voltage to the first transfer gate FTR.

(Effects of Solid-State Image Sensing Device according to Embodiment)

Hereinafter, effects of the solid-state image sensing device of the embodiment will be explained.

According to the solid-state image sensing device of the embodiment, it becomes possible to suppress a dark current and to suppress transfer failure during the global shutter operation. The details of this effect will be explained below.

Figure 6:
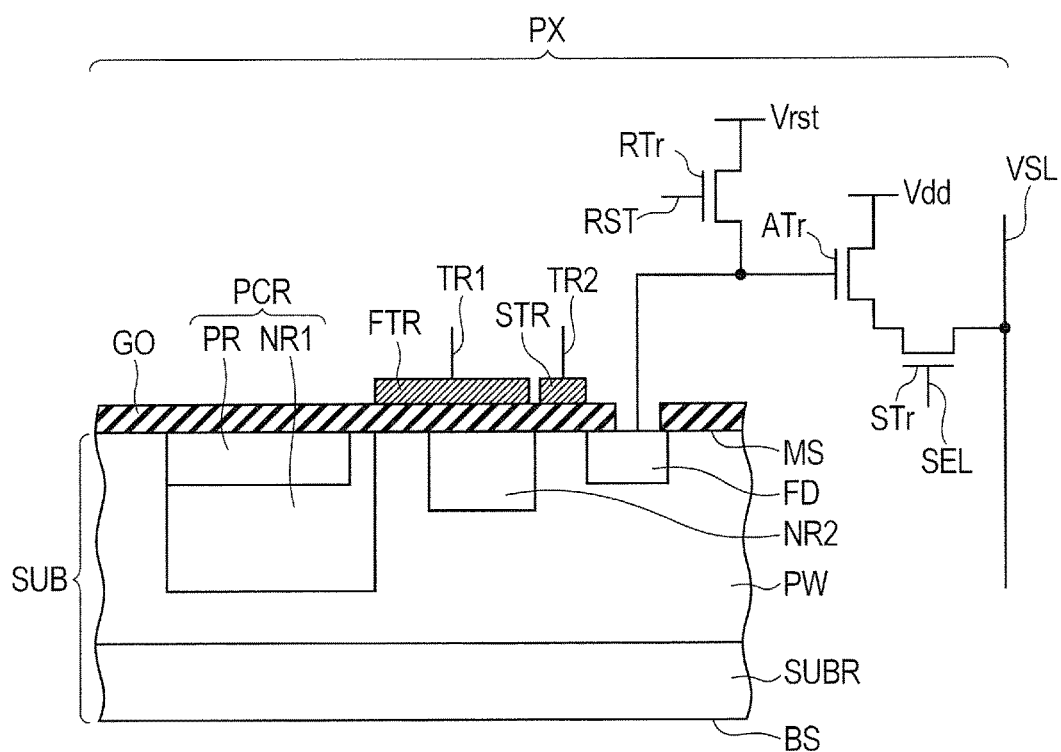
FIG. 6 is a schematic diagram showing a configuration of a unit pixel of a solid-state image sensing device according to a first comparative example.

Now, referring to a first comparative example, suppression of a dark current will be explained. As shown in FIG. 6, a solid-state image sensing device of the first comparative example has a semiconductor substrate SUB. The semiconductor substrate SUB has a main surface MS and a back surface BS. Over the main surface MS, a gate insulating film GO is formed. In the semiconductor substrate SUB, a photoelectric conversion region PCR, a charge holding region EHR, and a floating diffusion region FD are provided. In the above respects, the solid-state image sensing device of the first comparative example is the same as the solid-state image sensing device of the embodiment.

However, the solid-state image sensing device of the first comparative example differs from the solid-state image sensing device of the embodiment in that it does not have a pinning region PIN.

Figure 7:
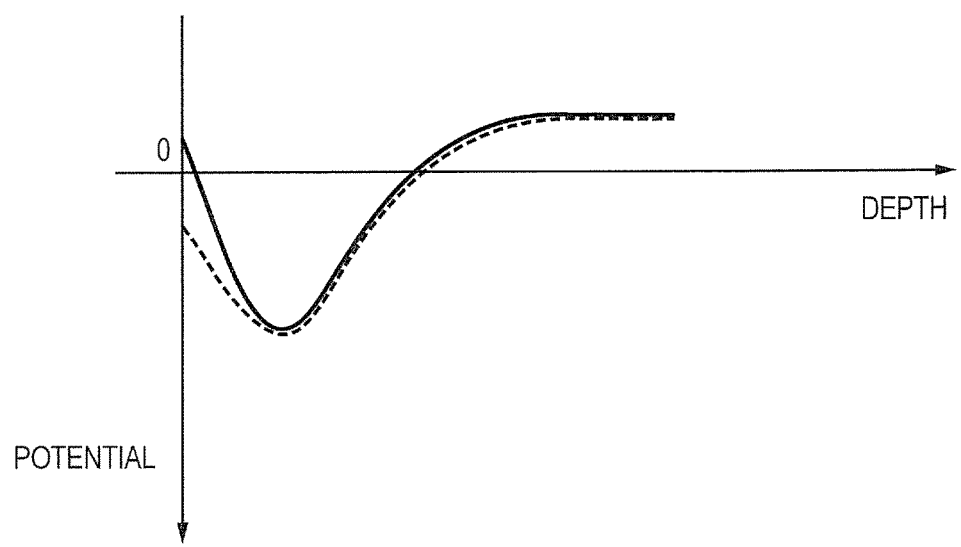
FIG. 7 is a schematic diagram showing variations in potential along line VII-VII of FIG. 2.

When the first transfer gate FTR is in the off state, along a depth direction (a direction from the main surface MS to the back surface BS), the charge holding region EHR of the solid-state image sensing device of the first comparative example shows a potential profile indicated by a dotted line in FIG. 7. On the other hand, when the first transfer gate FTR is in the off state, the charge holding region EHR of the solid-state image sensing device of the embodiment shows a potential profile along a depth direction indicated by a solid line in FIG. 7.

As described above, according to the solid-state image sensing device of the embodiment, pinning is caused in the pinning region PIN when the first transfer gate FTR is in the off state. Therefore, it becomes possible to suppress generation of electrons due to a boundary level etc. at the boundary between the main surface MS of the semiconductor substrate SUB and the gate insulating film GO and to suppress an occurrence of a dark current.

On the other hand, in the solid-state image sensing device of the first comparative example, the charge holding region EHR does not have a pinning region PIN. Therefore, the generation of electrons is not suppressed at the boundary between the main surface MS of the semiconductor substrate SUB and the gate insulating film GO. Consequently, along the potential profile, the generated electrons flow into the charge holding region EHR as a dark current.

When operating in the global shutter mode, in the charge holding region EHR, charges transferred to the charge holding region EHR from the photoelectric conversion region PCR are to be held for up to about one frame time. In the solid-state image sensing device of the embodiment, inflow to the charge holding region EHR is suppressed as described above. Therefore, even when the solid-state image sensing device of the embodiment is in the global shutter mode and the charges are held in the charge holding region EHR for a long time, it is not likely to be affected by a dark current.

Next, a suppression of transfer failure will be explained. When the first transfer gate FTR is turned on and the charges accumulated in the photoelectric conversion region PCR are transferred to the charge holding region EHR, the pinning region PIN is depleted. As a result, even if the pinning region PIN exists, transfer failure is not likely to occur. As described above, according to the solid-state image sensing device of the embodiment, it becomes possible to suppress a dark current and to suppress transfer failure during the global shutter operation.

Hereinafter, an additional effect of the solid-state image sensing device according to the embodiment will be explained. In a case where the impurity concentration of the pinning region PIN is made lower than that of the p type well, when the charges accumulated in the photoelectric conversion region PCR are transferred to the charge holding region EHR, the pinning region PIN can easily be depleted in the solid-state image sensing device according to the embodiment. Therefore, in this case, it becomes possible to further suppress transfer failure.

In the solid-state image sensing device of the embodiment, when an impurity concentration of the second n type region NR2 is made lower than that of the floating diffusion region FD, a potential gradient between the charge holding region EHR and the floating diffusion region FD increases. As a result, complete transfer of the charges between the charge holding region EHR and the floating diffusion region FD is achieved more reliably.

In the solid-state image sensing device of the embodiment, when a width of the pinning region PIN is made equal to or greater than a width of the second n type region NR2, it becomes possible to further suppress transfer failure. This effect will be explained in detail below with reference to a second comparative example.

Figure 8:
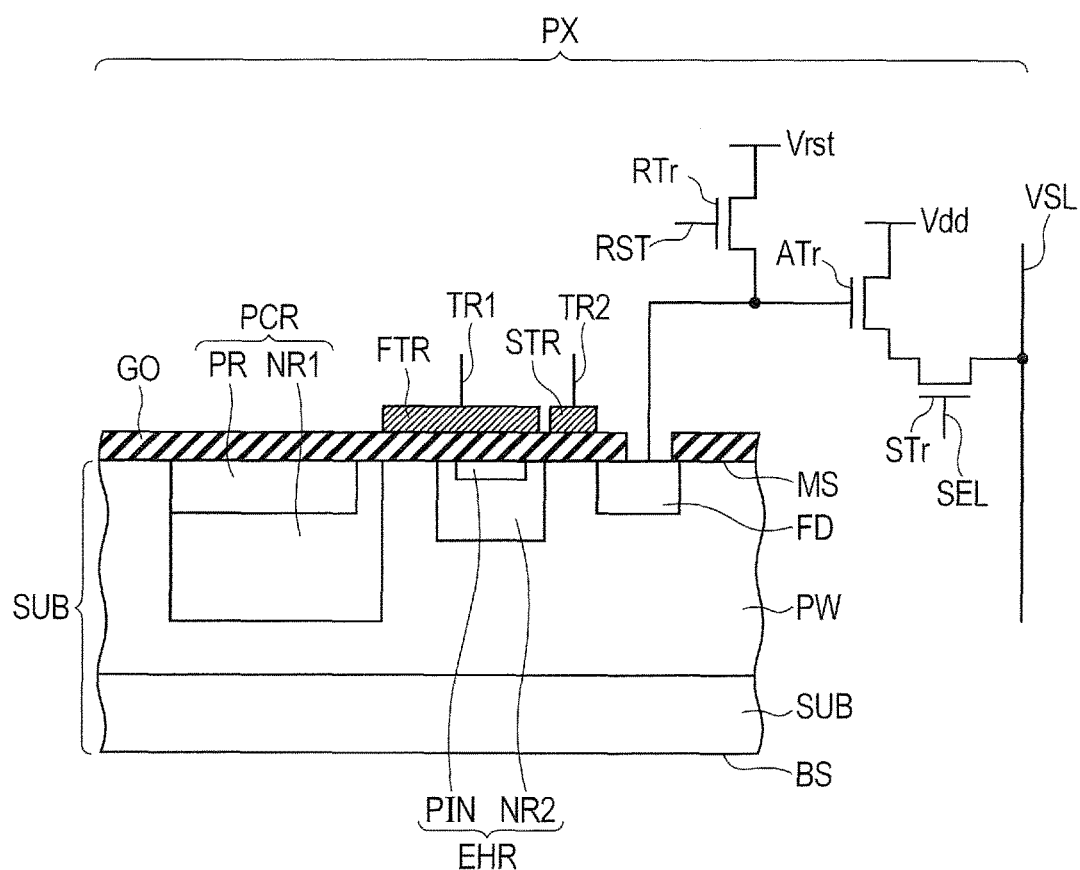
FIG. 8 is a schematic diagram showing a configuration of a unit pixel of a solid-state image sensing device according to a second comparative example.

As shown in FIG. 8, a solid-state image sensing device of the second comparative example has a semiconductor substrate SUB. The semiconductor substrate SUB has a main surface MS and a back surface BS. Over the main surface MS, a gate insulating film GO is formed. In the semiconductor substrate SUB, a photoelectric conversion region PCR, a charge holding region EHR, and a floating diffusion region FD are provided. The charge holding region EHR has a pinning region PIN. In the above respects, the solid-state image sensing device of the second comparative example is the same as the solid-state image sensing device of the embodiment.

However, in the solid-state image sensing device of the second comparative example, being different from the solid-state image sensing device of the embodiment, a width of the pinning region PIN is smaller than that of the second n type region NR2.

Figure 9:
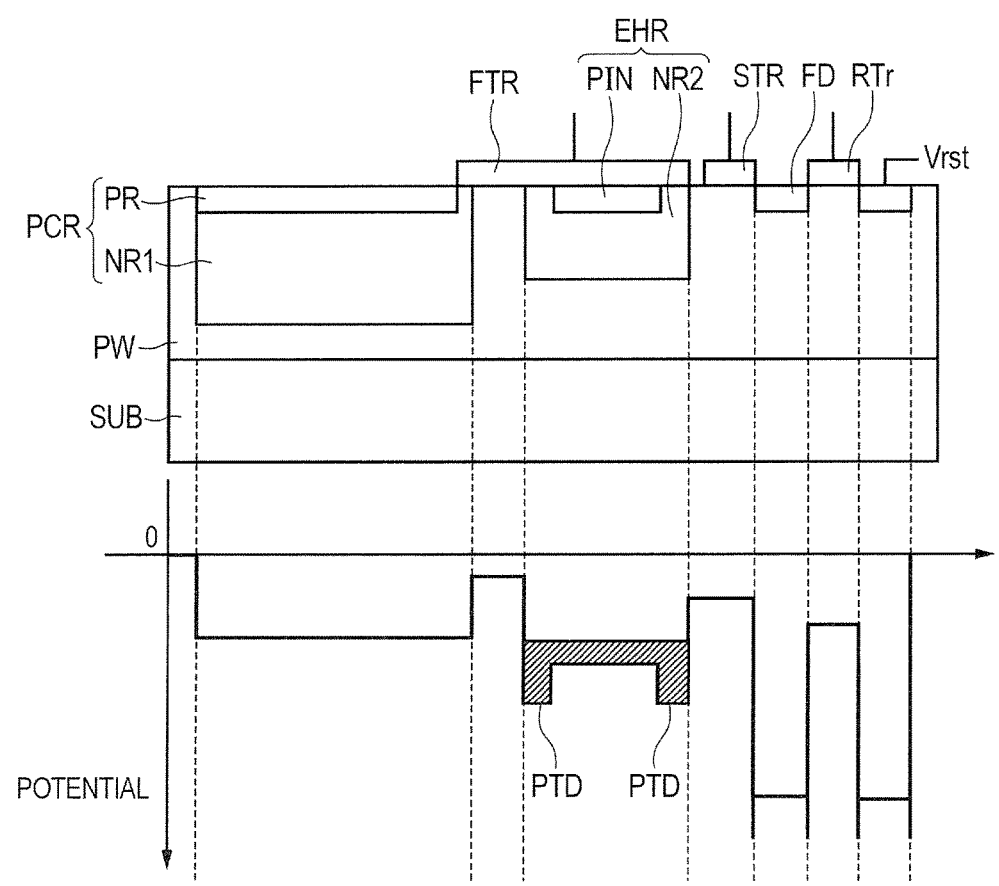
FIG. 9 is a potential diagram of the solid-state imaging device according to the second comparative example.

As a result, in the solid-state image sensing device of the second comparative example, as shown in FIG. 9, a potential dip PTD is formed at an edge of the potential well of the charge holding region EHR. In the potential dip PTD, its potential is deeper than other parts of the charge holding region EHR.

In the case where such a potential dip PTD is formed, when charges are transferred to the charge holding region EHR from the photoelectric conversion region PCR, some of the charges are trapped in the potential dip PTD. The potential of the potential dip PTD is deeper than other parts of the charge holding region HER. Therefore, when transferred to the floating diffusion region FD from the charge holding region EHR, the charges trapped in the potential dip are liable to remain.

However, in the solid-state image sensing device of the embodiment, when the width of the pinning region is made equal to or greater than the width of the second n type region NR2, such a potential dip is not formed. Therefore, in this case, it becomes possible to further suppress transfer failure.

In the solid-state image sensing device of the embodiment, in a case where the pinning region PIN is of a p conductivity type and a concentration of p type impurities of the pinning region PIN is lower than that of the p type well region PW, when the first transfer gate FTR is turned on, the pinning region PIN is reliably depleted. Therefore, in this case, it becomes possible to further suppress transfer failure.

In the solid-state image sensing device of the embodiment, when the pinning region PIN is of an n conductivity type, it is not necessary, in order to form the pinning region, to perform ion implantation of p type impurities besides the second n type region NR2. Therefore, a process of forming the pinning region PIN can be simplified.

In the solid-state image sensing device of the embodiment, when a concentration of n type impurities of the second n type region NR2 is made lower than that of the floating diffusion region FD, the potential gradient between the charge holding region HER and the floating diffusion region increases. As a result, the complete transfer of the charges is achieved more reliably.

It is considered that the embodiment disclosed herein is illustrative and not restrictive in all aspects. The scope of the present invention is defined by the scope of claims rather than the above description, and all of changes that fall within the meaning and range of equivalency of the claims are therefore intended to be embraced therein.

What is claimed is:

1. A solid-state image sensing device comprising:
   a semiconductor substrate having a main surface and a back surface on an opposite side of the main surface;

a well region in contact with the main surface in the semiconductor substrate and being of a first conductivity type;

a photoelectric conversion region in contact with the main surface in the well region and being of a second conductivity type;

a charge holding region in contact with the main surface in the well region;

a floating diffusion region arranged in contact with the main surface in the well region and being of the second conductivity type;

a first transfer gate disposed, over the main surface, facing a first portion of the well region between the photoelectric conversion region and the charge holding region, the photoelectric conversion region and the charge holding region being insulated from each other; and a second transfer gate disposed, over the main surface, facing a second portion of the well region between the charge holding region and the floating diffusion region, the charge holding region and the floating diffusion region being insulated from each other, wherein the charge holding region includes: a pinning region in contact with the main surface; and an n type region in contact with a back surface side of the pinning region, and wherein a width of the pinning region is greater than a width of the n type region.

2. The solid-state image sensing device according to claim 1, wherein a conductivity type of the pinning region and the second conductivity type is a p type, and wherein an impurity concentration of the pinning region is lower than that of the well region.

3. The solid-state image sensing device according to claim 1, wherein a conductivity type of the pinning region is an n type, wherein an impurity concentration of the pinning region is lower than that of the n type region, and wherein, when in an off state, a negative potential for causing pinning in the pinning region is applied to the first transfer gate.

4. The solid-state image sensing device according to claim 1, wherein an impurity concentration of the n type region is lower than that of the floating diffusion region.

\* \* \* \* \*